(12) United States Patent  
Kajikawa

(10) Patent No.: US 7,656,625 B2  
(45) Date of Patent: Feb. 2, 2010

(54) DISC APPARATUS

(75) Inventor: Kazuki Kajikawa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 243 days.

(21) Appl. No.: 11/969,567

(22) Filed: Jan. 4, 2008

(65) Prior Publication Data

US 2008/0164833 A1 Jul. 10, 2008

(30) Foreign Application Priority Data

Jan. 6, 2007 (JP) .............................. 2007-000880

(51) Int. Cl.
*H02P 7/08* (2006.01)

(52) U.S. Cl. .............................. 361/29; 361/23; 361/30; 361/33; 361/110

(58) Field of Classification Search .................. 361/29, 361/23, 30, 33, 110
See application file for complete search history.

(56) References Cited

U.S. PATENT DOCUMENTS

| 5,506,539 | A | * | 4/1996 | Kelly et al. | .................. | 327/379 |
| 6,107,926 | A | | 8/2000 | Kifuku et al. | | |
| 6,512,346 | B2 | | 1/2003 | Yoshimura | | |
| 6,778,930 | B2 | * | 8/2004 | Sugawara et al. | ............ | 702/107 |
| 7,053,676 | B2 | * | 5/2006 | Kranz | ......................... | 327/108 |
| 7,237,060 | B2 | * | 6/2007 | Satou et al. | .................. | 711/112 |

FOREIGN PATENT DOCUMENTS

JP  10-191551 A  7/1998
JP  2001-298988 A  10/2001

* cited by examiner

*Primary Examiner*—Rita Leykin
(74) *Attorney, Agent, or Firm*—Crowell & Moring LLP

(57) ABSTRACT

A disc apparatus which can accurately judge whether or not a spindle motor is at fault due to a short circuit is provided.

A disc apparatus (1) includes a spindle motor (3) which rotates a disc (2), a differential operational amplifier (5) which detects a difference between voltages of a positive terminal and a negative terminal of the spindle motor (3) as a detecting voltage level, a failure judgment unit (10) which judges whether or not the spindle motor (3) is at fault based on the detecting voltage level, and a disc determination means (12) which determines a type of the disc (2). The failure judgment unit (10) judges that the spindle motor (3) is at fault when the detecting voltage level becomes lower than a predetermined threshold level five times continuously during a start-up that the spindle motor (3) starts driving when the disc (2) is in stopped state while the disc determination means (12) determines the type of the disc (2). Consequently, the failure judgment unit (10) can accurately judge the failure in the spindle motor (3) without extending the start-up time.

3 Claims, 4 Drawing Sheets

DISC APPARATUS

BACKGROUND OF THE INVENTION

1. Field of the Invention

The present invention relates to a disc apparatus having a DC motor which rotates a disc.

2. Description of the Related Art

In a disc apparatus which rotates a disc such as CD, CD-R, DVD or the like by using a DC motor such as a spindle motor to record and reproduce images and so on, dust particles are sometimes generated due to an abrasion of a brush in the DC motor and cause a short circuit of a commutator in the DC motor. When the commutator is short-circuited, the spindle motor stops rotating, and the disc thereby stops rotating. When the disc stops rotating, a controller which controls the disc apparatus increases an output current of a drive IC which drives the DC motor to speed up a rotation speed of the spindle motor. The drive IC produces heat due to the increase of the output current. The heat may cause a malfunction of the drive IC and a large current flowing through an actuator. Moreover, when the disc stops rotating, the controller gets less able to obtain an accurate operation of the actuator. As a result, the controller forces the drive IC to operate to rotate the disc. In this case, the drive IC passes the large current through the actuator and consequently, a cover of the actuator sometimes burns.

In Japanese Laid-Open Patent Publication No. 10-191551, there is a disclosure of a means which detects whether or not an electrical current which flows through a motor goes beyond a predetermined level and judges that the motor is short-circuited when the excess of the electrical current over the predetermined level continues for a predetermined period of time. In Japanese Laid-Open Patent Publication No. 2001-298988, there is a disclosure of a means which detects whether or not a voltage follows a pulse signal in an apparatus which applies the voltage to a motor by making the pulse signal on and off and which judges that the motor is short-circuited when the state that voltage does not follow the pulse, signal continues for a predetermined period of time.

However, in the techniques shown in the above publications, the judgment whether the motor is short-circuited or not is based on the abnormal state of the electrical current and the voltage continuing for the predetermined period of time, so that the techniques enable the detection of the state that the motor is constantly short-circuited, however, they do not enable the detection of the state that the motor is partially short-circuited and the states of short circuit and non-short circuit alternately arise according to the rotation of the motor.

The present invention is to solve the problem described above, and an object of the present invention is to provide a disc apparatus having a spindle motor to rotate a disc which can judge accurately whether or not the spindle motor is at fault due to a short circuit and also prevent the spindle motor from driving in case of failure in the spindle motor due to the short circuit.

SUMMARY OF THE INVENTION

The above object of the present invention is to provide a disc apparatus which includes a DC motor which rotates a disc, a driving unit which supplies an offset voltage to the DC motor through two voltage supply lines, a controller which instructs the driving unit to supply the offset voltage, and a disc determination means which determines a type of the disc, which is either a DVD or CD, and further includes a detector which is connected to the two voltage supply lines to detect a difference between voltages of the two voltage supply lines as a detecting voltage level during a start-up that the DC motor starts driving when the disc is in stopped state while the disc determination means determines the type of the disc and a failure judgment unit which judges whether or not the DC motor is at fault according to the detecting voltage level, wherein the failure judgment unit judges that the DC motor is at fault when the detecting voltage level is lower than a predetermined threshold level, and the controller controls the driving unit not to drive the DC motor in response to the judgment of the failure judgment unit that DC motor is at fault.

According to the above configuration, the detector detects the detecting voltage level during the start-up that the DC motor starts driving when the disc is in stopped state while the disc determination means determines the type of the disc. The failure judgment unit judges that the DC motor is at fault due to a short circuit when the detecting voltage level which is detected by the detector is lower than the predetermined threshold level. Consequently, the failure judgment unit can judge whether or not the DC motor is at fault without extending the start-up time by judging the failure in the DC motor while the disc determination means determines the type of the disc.

It is preferable that the detector detects the detecting voltage level the predetermined number of times, compares the detecting voltage level and the predetermined threshold level every time the detecting voltage level is detected, and judges that the DC motor is at fault when the detecting voltage level is lower than the threshold level the predetermined number of times continuously.

According to the above configuration, the failure judgment unit can judge whether or not the DC motor is at fault without extending the start-up time. Moreover, the failure judgment unit judges that the DC motor is at fault when the plural detecting voltage levels which are detected by the detector become lower than the predetermined threshold level the predetermined number of times continuously, so that the failure judgment unit can judge whether or not the DC motor is at fault accurately without the influence from the unexpected change of the detecting voltage level due to the scratch on the disc or the wobbling rotation of the disc due to the decentering.

It is more preferable that the disc apparatus which includes a DC motor which rotates a disc, a driving unit which supplies an offset voltage to the DC motor through two voltage supply lines, a controller which instructs the driving unit to supply the offset voltage, and a disc determination means which determines a type of the disc, which is a either DVD or CD, includes a detector which is connected to the two voltage supply lines to detect differences between voltages of the two voltage supply lines as detecting voltage levels at least forty times during a start-up that the DC motor starts driving when the disc is in stopped state while the disc determination means determines the type of the disc and a failure judgment unit which judges whether or not the DC motor is at fault according to the detecting voltage level, wherein the failure judgment unit compares the detecting voltage level and the predetermined threshold level every time the detecting voltage level is detected, and judges that the DC motor is at fault when the detecting voltage level is lower than the threshold level at least five times continuously, and the controller controls the driving unit not to drive the DC motor in response to the judgment of the failure judgment unit that DC motor is at fault.

According to the above configuration, the failure judgment unit judges that the DC motor is at fault when the plural detecting voltage levels which are detected by the detector become lower than the predetermined threshold level at least five times continuously during the start-up that the DC motor starts driving when the disc is in stopped state while the disc determination means determines the type of the disc. Consequently, the failure judgment unit can judge whether or not the DC motor is at fault without extending the start-up time. Moreover, the failure judgment unit can judge whether or not the DC motor is at fault accurately without the influence from the unexpected change of the detecting voltage level due to the scratch on the disc or the wobbling rotation of the disc due to the decentering.

BRIEF DESCRIPTION OF THE DRAWINGS

The present invention will be described below with reference to the annexed drawings. It is to be noted that all the drawings are shown for the purpose of illustrating the technical concept of the present invention or embodiments thereof, wherein.

DESCRIPTION OF THE PREFERRED EMBODIMENTS

Figure 1:
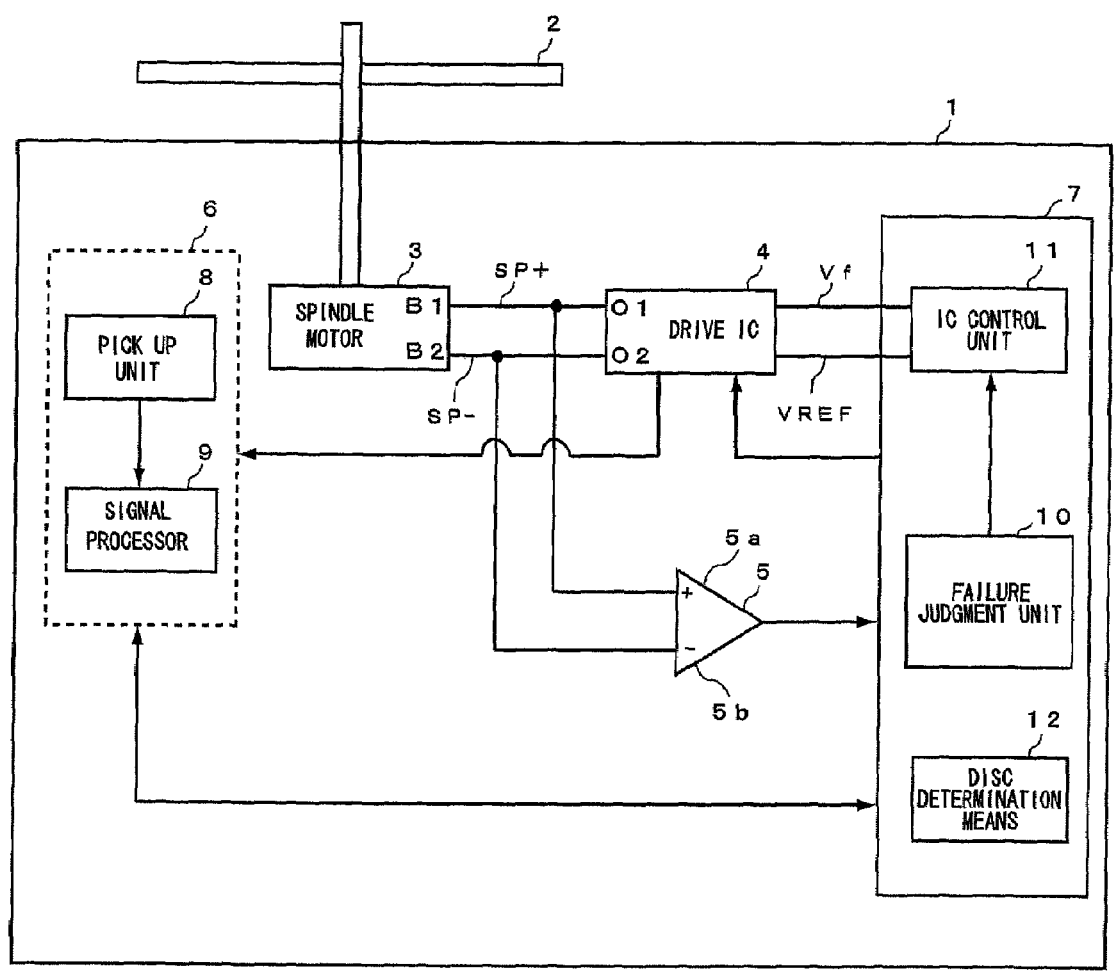
FIG. 1 is a schematic diagram of a disc apparatus according to a preferred embodiment of the present invention.

A disc apparatus according to a preferred embodiment of the present invention is described below with reference to FIGS. 1 to 4B. FIG. 1 shows a schematic configuration of the disc apparatus according to the preferred embodiment of the present invention. A disc apparatus 1 includes a spindle motor 3 (DC motor) which rotates a disc 2, a drive IC 4 (driving unit) which drives the spindle motor 3, a differential operational amplifier 5 (detector) which is connected between the spindle motor 3 and the drive IC 4, a recording and reproducing unit 6 which carries out a recording and reproducing process on the disc 2, and a controller 7 which controls the whole disc apparatus 1. The recording and reproducing unit 6 has a pickup unit 8 which read out data from the disc 2 and a signal processor 9 which carries out a decoding on the data which the pickup unit 8 reads out.

The controller 7 includes a failure judgment unit 10 which judges whether or not the spindle motor 3 is at fault based on the detecting voltage level which is outputted from the differential operation amplifier 5, an IC control unit 11 which controls the drive IC 4 according to the judgment of the failure judgment unit 10, and a disc determination means 12 which determines a type of the disc 2 according to a result of the pickup unit 8 reading out the data from the disc 2. At this time, the disc 2 is a DVD or CD, and the disc determination means 12 determines that the disc 2 is either a CD or DVD.

The IC control unit 11 provides a reference voltage VREF which is a reference voltage based on signals which are received from the pickup unit 8 to show the rotational state of the disc 2, and indicates a provision of an offset voltage Vf which shows a difference from the reference voltage to drive the spindle motor 3. The drive IC 4 has a terminal O1 and a terminal O2. The terminal O1 is connected to a brush B1 of the spindle motor 3 through a voltage supply line SP+, and the terminal O2 is connected to a brush B2 of the spindle motor 3 through a voltage supply line SP−. The drive IC 4 sets voltages of the terminal O1 and the terminal O2 based on the reference voltage VREF and the offset voltage Vf which are received by the IC control unit 11. A non-inverting input terminal 5a of the differential operational amplifier 5 is connected to the voltage supply line SP+ and an inverting input terminal 5b of the differential operation amplifier 5 is connected to the voltage supply line SP−. The differential operation amplifier 5 detects a difference between voltages of the brush B1 and the brush B2 which is a difference between potentials of the non-inverting input terminal 5a and the inverting input terminal 5b. The differential operational amplifier 5 outputs the detected voltage difference to the failure judgment unit 10 as the detecting voltage level.

The failure judgment unit 10 judges whether or not the spindle motor 3 is at fault based on the detecting voltage level which inputted from the differential operational amplifier 5. The failure judgment unit 10 retains a predetermined threshold level corresponding to the detecting voltage level as a basis to judge whether or not the spindle motor 3 is at fault. When the detecting voltage level inputted from the differential operational amplifier 5 is lower than the threshold level, the failure judgment unit 10 judges that the spindle motor 3 is at fault due to the short circuit and then transmits a failure signal which indicates the failure in the spindle motor 3 to the IC control unit 11. When the IC control unit 11 receives the failure signal from the failure judgment unit 10, the IC control unit 11 instructs the drive IC 4 not to drive the spindle motor 3. Consequently, the spindle motor 3 which is at fault stops driving, and the large current flowing through the actuator is avoided, and thereby the trouble of the cover of the actuator burning can be prevented.

Figure 2:
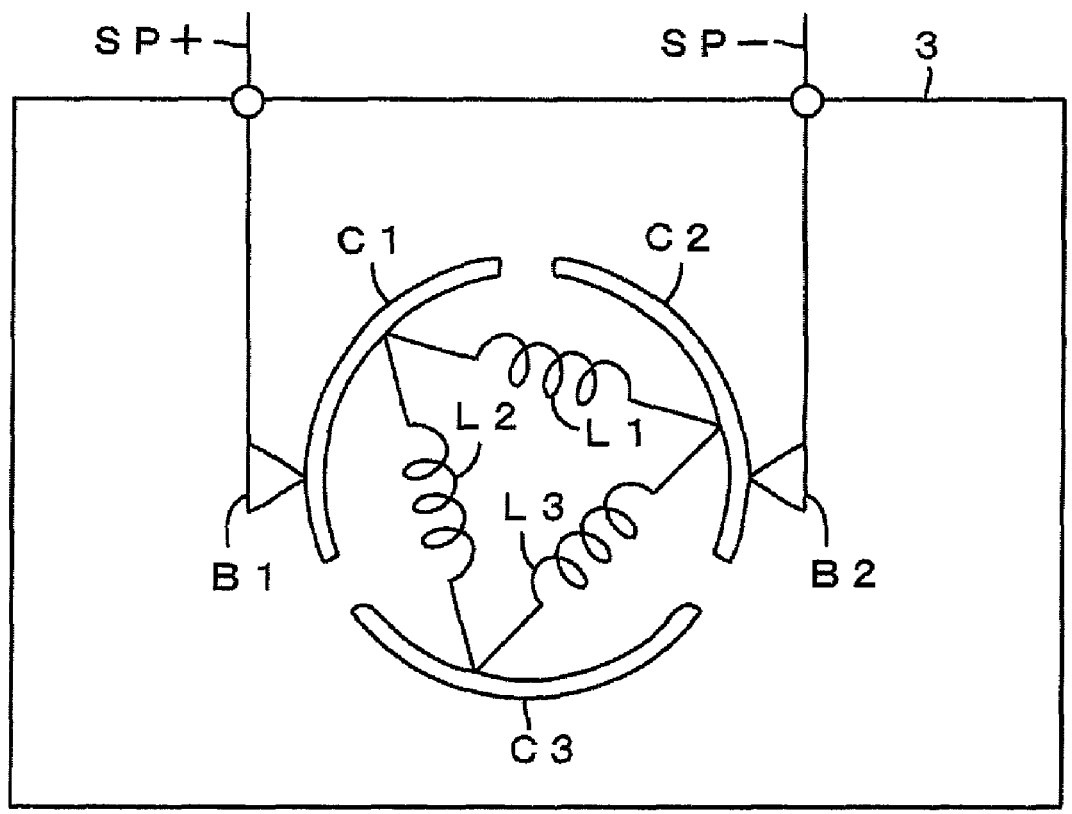
FIG. 2 is a schematic diagram of a spindle motor according to the present preferred embodiment.

FIG. 2 shows a schematic configuration of the spindle motor 3 according to the present preferred embodiment. The spindle motor 3 which is the DC motor includes the brush B1 which is a positive terminal, a brush B2 which is a negative terminal, commutators C1, C2, and C3, and coils L1, L2, and L3. The brush B1 is connected to the voltage supply line SP+, and the brush B2 is connected to the voltage supply line SP−. When the drive IC 4 provides DC (direct-current) voltage to the brush B1 and the brush B2 through the voltage supply line SP+ and the voltage supply line SP−, the DC electricity passes between the brush B1 and the brush B2 through part of the commutators C1, C2, and C3 and part of the coils L1, L2, and L3. The above configuration leads to the rotation of the spindle motor 3.

When the abrasion occurs on the brush B1 and B2 due to the rotation of the spindle motor 3, dust particles of the brush B1 and the brush B2 are generated. When the dust particles get into spaces among the commutators C1, C2, and C3, the short circuit occurs between the brush B1 and the brush B2. When there is the short circuit between the brush B1 and the brush B2, the detecting voltage level which is outputted from the differential operational amplifier 5 to the failure judgment unit 10 becomes almost 0. At this time, the short circuits in the two spaces or all of the three spaces among the commutators C1, C2, and C3 are designated as a dead short circuit. The short circuit in one of the three spaces among the commutator C1, C2, and C3 is designated as a partial short circuit.

When there is the dead short circuit in the spindle motor 3, there is the short circuit constantly between the brush B1 and the brush B2, so that the commutators C1, C2, and C3 do not rotate. In contrast, when there is the partial short circuit in the spindle motor 3, the state that there is the short circuit between the brush B1 and the brush B2 and the state that there is no short circuit between the brush B1 and the brush B2 alternately arise according to the rotation of the commutators C1, C2, and C3. The differential operational amplifier 5 detects the detecting voltage level of almost 0 when there is the short circuit between the brush B1 and the brush B2, and in contrast, the differential operational amplifier 5 detects the detecting voltage level which is higher than 0 when there is no short circuit between the brush B1 and the brush B2. The failure judgment unit 10 judges whether there is the short circuit in the spindle motor 3 or not in accordance with the detecting voltage level which the differential operational amplifier 5 detects.

Figure 3:
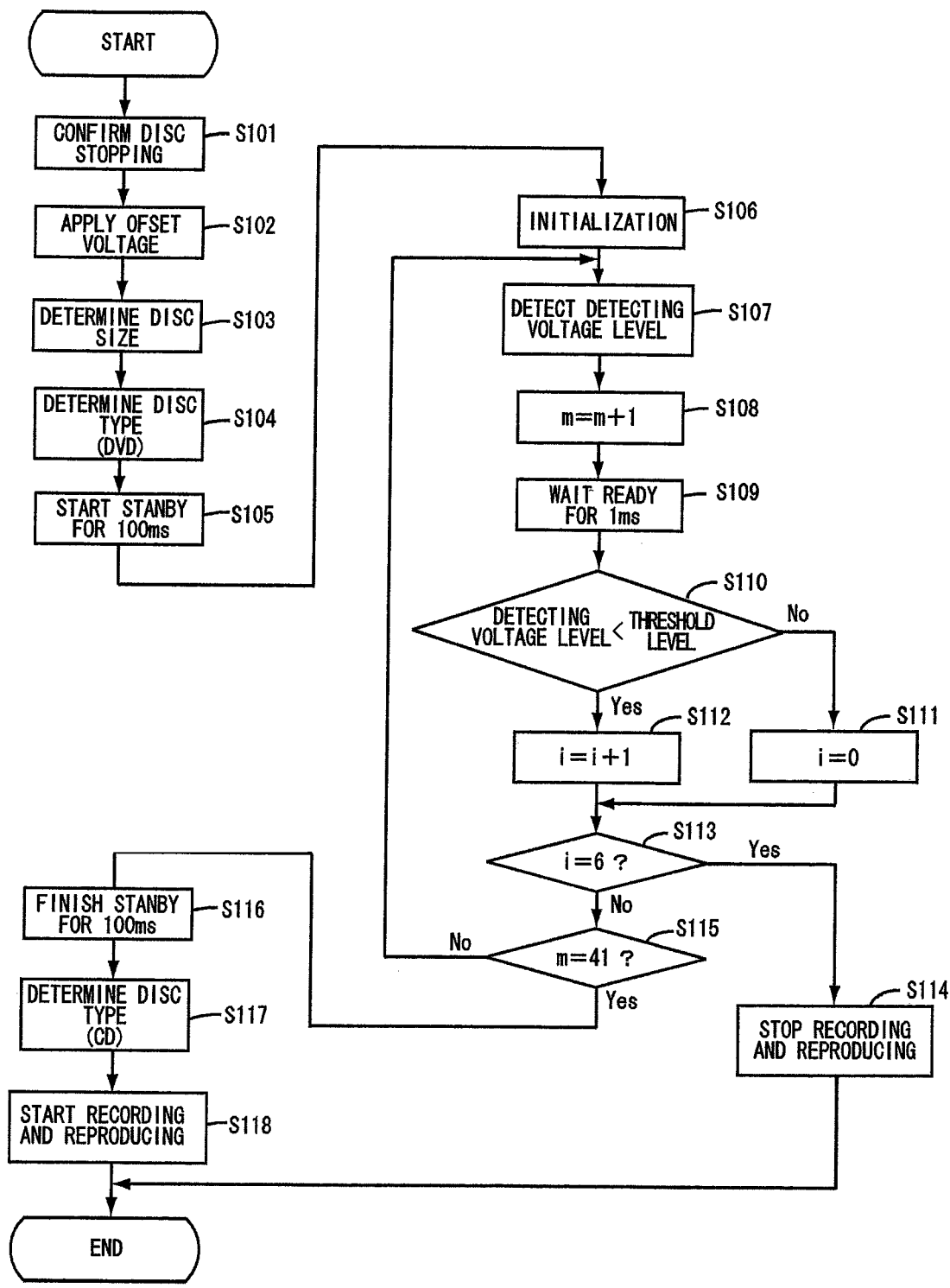
FIG. 3 is a flow chart for judging the failure in the spindle motor according to the present preferred embodiment.

FIG. 3 shows a flow chart for judging the failure in the spindle motor 3 according to the present preferred embodiment. The judgment of the failure in the spindle motor 3 is carried out during a start-up that the spindle motor 3 starts driving when the disc 2 is in stopped state while the disc determination means 12 determines the type of the disc. The start-up includes the time when the recording and reproducing unit 6 starts recording and reproducing, for example. When the recording and reproducing unit 6 starts recording and reproducing, the IC control unit 11 confirms that the disc 2 is stationary based on the signals which are outputted from the signal processor 9 to indicate the number of rotations of the disc 2 (S101). When the disc 2 is not stationary in the step S101, the IC control unit 11 waits ready for the disc 2 to stop. When the disc 2 stops, the drive IC 4 applies the offset voltage to the spindle motor 3 based on the reference voltage VREF and the offset voltage Vf which are instructed by the IC control unit 11 (S102). The controller 7 determines the diameter of the disc 2, which is either 8 cm or 12 cm, according to the data of the disc 2 which are read by the pickup unit 8 (S103).

Subsequently, the disc determination means 12 determines whether the disc 2 is the DVD or not based on the signals which are outputted from the signal processor 9 when the controller 7 makes the pickup unit 8 irradiate the disc 2 with a laser light for DVD (S104). When the disc determination means 12 determines whether the disc 2 is the DVD or not, the controller 7 controls the pickup unit 8 to wait ready for 100 ms until the pickup unit 8 irradiates the disc 2 with a laser light for CD (S105). The above steps can prevent the pickup unit 8 from irradiating the disc 2 with the laser light for the DVD and the laser light for the CD simultaneously.

When the controller 7 controls the pickup unit 8 to wait ready for 100 ms (S105), the failure judgment unit 10 sets a variable m which is used to count the number of times that the differential operational amplifier 5 detects the detecting voltage level and a variable i which is used to count the number of times that the detecting voltage level gets lower continuously than the threshold level to be 0 (S106). When the disc 2 rotates 180 degrees or more, the controller 7 makes the differential operational amplifier 5 detect the difference between the voltage on the voltage supply line SP+ and the voltage on the voltage supply line SP− as the detecting voltage level and also makes the differential operation amplifier 5 output the detecting voltage level to the failure judgment unit (S107). When the differential operational amplifier 5 detects the detecting voltage level, the failure judgment unit 10 adds 1 to the variable m (S108). Subsequently, the failure judgment unit 10 waits ready for 1 ms before carrying out the judgment whether or not the spindle motor 3 is at fault (S109). The failure judgment unit 10 waits for 1 ms to delay the timing of the differential operational amplifier 5 detecting the detecting voltage level continuously. The differential operational amplifier 5 can detect the detecting voltage level a couple dozen times to hundreds of times instantaneously and continuously. In case of detecting the detecting voltage level continuously without delaying the timing, the differential operational amplifier 5 detects the detecting voltage level several times when the spindle motor 3 scarcely rotates. It is preferable that the failure judgment unit 10 judges whether or not the spindle motor 3 is at fault according to the detecting voltage level in the various conditions while the spindle motor 3 rotates. When the failure judgment unit 10 waits ready for 1 ms in the step S109, the differential operation amplifier 5 can detect the detecting voltage level in the various rotational state of the spindle motor 3.

Subsequently, the failure judgment unit 10 compares the detecting voltage level and the predetermined threshold level (S110). When the detecting voltage level is not lower than the threshold level (No in S110), the failure judgment unit 10 sets the variable i to be 0 (S111) and carries out the step S113. In contrast, when the detecting voltage level is lower than the threshold level (Yes in S110), the failure judgment unit 10 adds 1 to the variable i (S112). The detecting voltage level sometimes becomes lower than the threshold level temporarily due to a scratch on the disc 2 or a wobbling rotation of the disc 2 due to decentering. In contrast, when the spindle motor 3 is at fault due to the partial short circuit, the detecting voltage level becomes lower than the threshold level continuously. Consequently, the failure judgment unit 10 does not immediately judge that the spindle motor 3 is at fault even when it judges that the detecting voltage level becomes lower than the threshold level, however, the failure judgment unit 10 can judge whether or not the spindle motor 3 is at fault accurately without an influence from an unexpected change of the detecting voltage level by judging whether or not the detecting voltage level becomes lower than the threshold level the predetermined number of times continuously. The present embodiment is based on a premise that the detecting voltage level does not become lower than the threshold level five times continuously in case of the unexpected change of the detecting voltage level. Consequently, the failure judgment unit 10 judges that the spindle motor 3 is at fault when the detecting voltage level becomes lower than the threshold level five times continuously.

Subsequently, the failure judgment unit 10 judges whether the variable i is 6 or not (S113). In the step S113, when the variable i is 6, which means that the detecting voltage level becomes lower than the threshold level five times continuously, the failure judgment unit 10 judges that the spindle motor 3 is at fault (Yes in S113). When the failure judgment unit 10 judges that the spindle motor 3 is at fault, the IC control unit 11 instructs the drive IC 4 not to drive the spindle motor 3, and the controller 7 stops the recording and reproducing unit 6 recording and reproducing (S114) and completes the judgment whether or not the spindle motor 3 is at fault. Consequently, it is possible to prevent the drive IC 4 from passing the electrical current through the faulty spindle motor 3 and thereby prevent the large current from flowing through the actuator, so that the trouble of the cover of the actuator burning can be prevented.

In the step S113, when the variable i is not 6, the failure judgment unit 10 does not judge that the spindle motor 3 is at fault (No in S113). The failure judgment unit 10 according to the present preferred embodiment can judge accurately the failure in the spindle motor 3 by judging whether or not the detecting voltage level becomes lower than the threshold level five times continuously with respect to more than forty detecting voltage levels. Consequently, the failure judgment unit 10 judges whether or not the variable is 41 (S115). In the step S115, when the variable m is not 41 (No in S115), which means that the differential operational amplifier 5 does not detect the detecting voltage level forty times, the controller 7 makes the differential operational amplifier 5 detect the detecting voltage level (S107). In the step S115, when the variable m is 41 (Yes in S115), the failure judgment unit 10 judges that the spindle motor 3 is not at fault, and the disc determination means 12 waits for 100 ms (S116).

Subsequently, the disc determination means 12 makes the pickup unit 8 irradiate the disc 2 with the laser light for CD, and determines whether the disc 2 is the CD or not based on the signals which are outputted from the signal processor 9 (S117). The controller 7 makes the recording and reproducing unit 6 start recording and reproducing by making the pickup unit 8 irradiate the disc 2 with the laser light according to the type of the disc 2 which is determined by the disc determination means 12 (S118), and completes the judgment whether or not the spindle motor 3 is at fault.

Figure 4A:
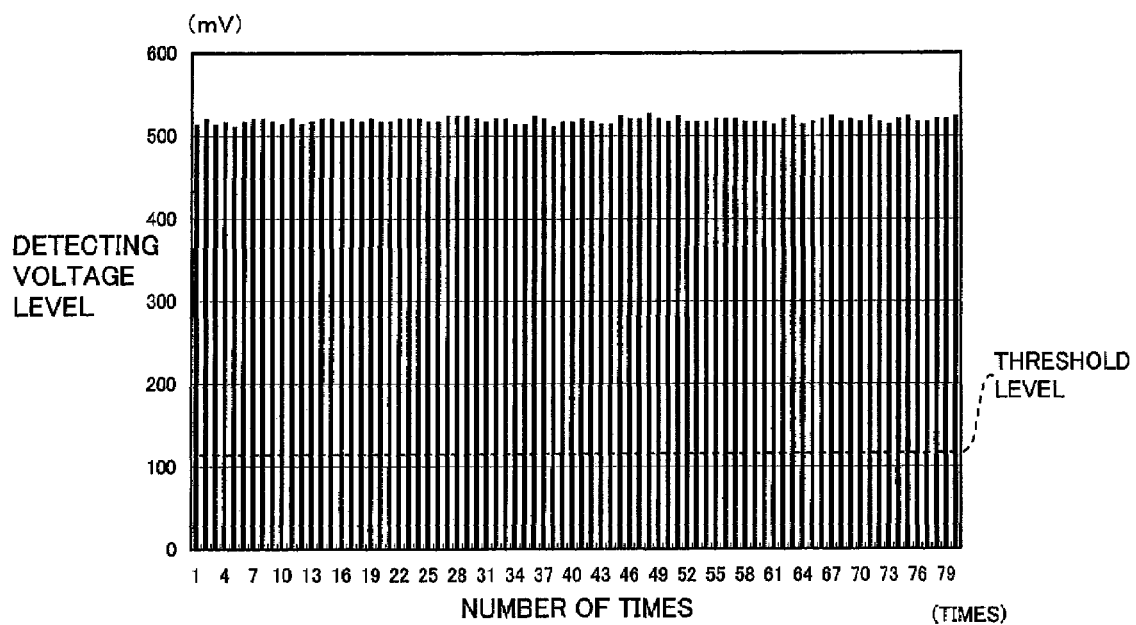
FIGS. 4A and 4B are diagrams showing variations of detecting voltage levels according to the present preferred embodiment.
Figure 4B:
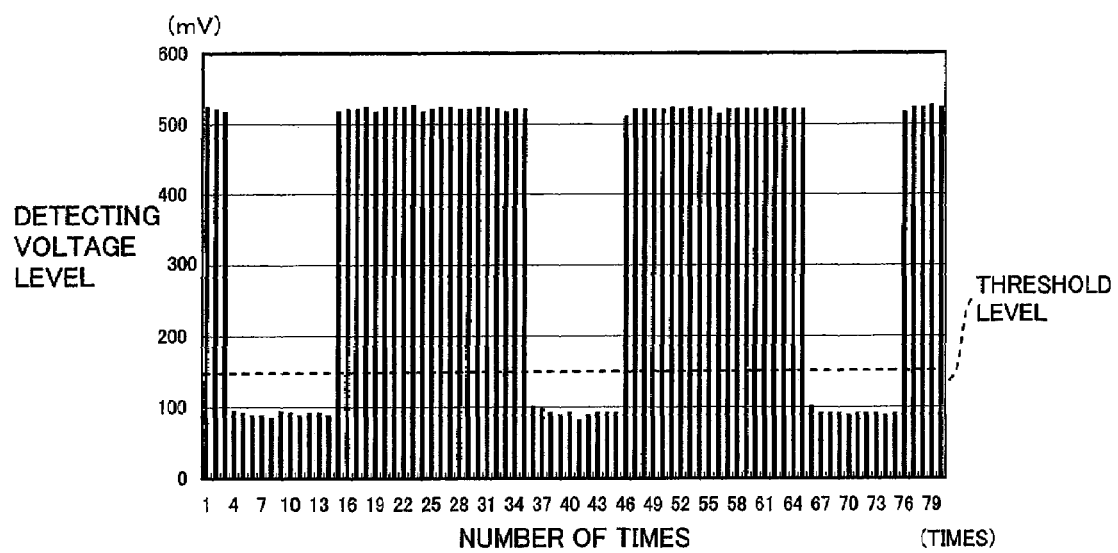

FIGS. 4A and 4B show variations of the detecting voltage levels according to the present preferred embodiment. FIG. 4A shows the variation of the detecting voltage level of the spindle motor 3 which is not at fault, and FIG. 4B shows the variation of the detecting voltage level of the spindle motor 3 which is at fault. In FIGS. 4A and 4B, a vertical axis indicates the detecting voltage level, and a horizontal axis indicates the number of times that the detecting voltage level is calculated. A dashed line indicates the threshold level, and the threshold level is set to 130 mV, for example. The spindle motor 3 is not at fault in FIG. 4A, so that the detecting voltage level does not become lower than the threshold level. The detecting voltage level is higher than the threshold level at first, however, it becomes lower than the threshold level more than four times continuously and subsequently higher than the threshold level again. The failure judgment unit 10 thereby judges that the spindle motor 3 is at fault.

As described above, in the present preferred embodiment, the failure judgment unit 10 judges the failure in the spindle motor 3 while the disc determination means 12 determines the type of the disc 2. Consequently, the judgment of the failure in the spindle motor 3 can be carried out smoothly without extending the start-up time. Moreover, the failure judgment unit 10 judges that the spindle motor 3 is at fault when the detecting voltage level becomes lower than the threshold level five times continuously. Consequently, the failure judgment unit 10 can judge whether or not the DC motor is at fault accurately without the influence from the unexpected change of the detecting voltage level due to the scratch on the disc or the wobbling rotation of the disc due to the decentering.

The present invention is not limited to the configuration of the above preferred embodiment, however, various modification are applicable, and for example, it is also applicable that the differential operational amplifier 5 detects the detecting voltage level more than forty times instead of detecting the detecting voltage level forty times. Moreover, for example, it is also applicable that the failure judgment unit 10 judges that the spindle motor 3 is at fault when the detecting voltage level becomes lower than the threshold level three times continuously.

What is claimed is:

1. A disc apparatus comprising:
a DC motor which rotates a disc;
a driving unit which supplies an offset voltage to the DC motor through two voltage supply lines;
a controller which instructs the driving unit to supply the offset voltage; and
a disc determination means which determines a type of the disc, which is either a DVD or CD, further includes
a detector which is connected to the two voltage supply lines to detect a difference between voltages of the two voltage supply lines as a detecting voltage level during a start-up that the DC motor starts driving when the disc is in stopped state while the disc determination means determines the type of the disc and
a failure judgment unit which judges whether or not the DC motor is at fault according to the detecting voltage level, wherein
the failure judgment unit judges that the DC motor is at fault when the detecting voltage level is lower than a predetermined threshold level, and
the controller controls the driving unit not to drive the DC motor in response to the judgment of the failure judgment unit that DC motor is at fault.

2. The disc apparatus according to claim 1, wherein
the detector detects the detecting voltage level the predetermined number of times during the start-up that the DC motor starts driving when the disc is in stopped state while the disc determination means determines the type of the disc, and
the failure judgment unit compares the detecting voltage level and the predetermined threshold level every time the detecting voltage level is detected, and judges that the DC motor is at fault when the detecting voltage level is lower than the threshold level the predetermined number of times continuously.

3. The disc apparatus according to claim 2, wherein
the detector detects the detecting voltage level at least forty times during the start-up that the DC motor starts driving when the disc is in stopped state while the disc determination means determines the type of the disc, and
the failure judgment unit compares the detecting voltage level and the predetermined threshold level every time the detecting voltage level is detected, and judges that the DC motor is at fault when the detecting voltage level is lower than the threshold level at least five times continuously.

* * * * *